US009793066B1

(12) United States Patent
Brock et al.

(10) Patent No.: US 9,793,066 B1
(45) Date of Patent: Oct. 17, 2017

(54) KEYBOARD HINGE MECHANISM

(71) Applicant: Apple Inc., Cupertino, CA (US)

(72) Inventors: John M. Brock, San Carlos, CA (US); Patrick Kessler, Cupertino, CA (US); Craig C. Leong, Cupertino, CA (US); Keith J. Hendren, Cupertino, CA (US); James J. Niu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 82 days.

(21) Appl. No.: 14/501,680

(22) Filed: Sep. 30, 2014

Related U.S. Application Data

(60) Provisional application No. 61/934,285, filed on Jan. 31, 2014.

(51) Int. Cl.
*H01H 3/12* (2006.01)
*H01H 13/83* (2006.01)
*H05K 1/18* (2006.01)
*H01H 13/52* (2006.01)

(52) U.S. Cl.
CPC ............ *H01H 3/125* (2013.01); *H01H 13/52* (2013.01); *H01H 13/83* (2013.01); *H05K 1/18* (2013.01); *H01H 2201/022* (2013.01); *H01H 2227/022* (2013.01)

(58) Field of Classification Search
CPC ........ H01H 3/125; H01H 13/52; H01H 13/83; H01H 2201/022; H01H 2227/022; H05K 1/18
USPC ......... 200/5 A, 308–317, 341–344, 461, 512
See application file for complete search history.

(56) References Cited

U.S. PATENT DOCUMENTS

| 3,657,492 | A | | 4/1972 | Arndt et al. |
| 3,917,917 | A | | 11/1975 | Murata |
| 4,095,066 | A | * | 6/1978 | Harris ............... H01H 21/22 200/458 |

(Continued)

FOREIGN PATENT DOCUMENTS

| CN | 2155620 | 2/1994 |
| CN | 2394309 | 8/2000 |

(Continued)

OTHER PUBLICATIONS

Elekson, "Reliable and Tested Wearable Electronics Embedment Solutions," http://www.wearable.technology/our-technologies, 3 pages, at least as early as Jan. 6, 2016.

(Continued)

*Primary Examiner* — Edwin A. Leon
(74) *Attorney, Agent, or Firm* — Brownstein Hyatt Farber Schreck, LLP

(57) ABSTRACT

Embodiments described herein provide a low travel switch mechanism. The low travel switch mechanism may include a substrate, a dome coupled to the substrate, a keycap, and an integrated pivot component disposed between the keycap and the dome. The integrated pivot component may include a hinge assembly coupled to a light guide structure. The hinge assembly may secure to the substrate, via one or more hinge interconnects, joints, or interlock features to form a pivot point. When the keycap receives a keystroke, the integrated pivot component may be operative to pivot about the pivot point and contact the dome to cause a switching event or operation.

31 Claims, 6 Drawing Sheets

(56) References Cited

U.S. PATENT DOCUMENTS

| | | | |
|---|---|---|---|
| 4,319,099 A | 3/1982 | Asher | |
| 4,349,712 A | 9/1982 | Michalski | |
| 4,484,042 A | 11/1984 | Matsui | |
| 4,937,408 A | 6/1990 | Hattori et al. | |
| 5,136,131 A | 8/1992 | Komaki | |
| 5,278,372 A | 1/1994 | Takagi et al. | |
| 5,340,955 A | 8/1994 | Calvillo et al. | |
| 5,382,762 A | 1/1995 | Mochizuki | |
| 5,408,060 A | 4/1995 | Muurinen | |
| 5,421,659 A | 6/1995 | Liang | |
| 5,422,447 A | 6/1995 | Spence | |
| 5,457,297 A | 10/1995 | Chen | |
| 5,481,074 A * | 1/1996 | English | H01H 13/705 200/343 |
| 5,504,283 A | 4/1996 | Kako et al. | |
| 5,512,719 A | 4/1996 | Okada et al. | |
| 5,625,532 A | 4/1997 | Sellers | |
| 5,804,780 A | 9/1998 | Bartha | |
| 5,828,015 A | 10/1998 | Coulon | |
| 5,847,337 A | 12/1998 | Chen | |
| 5,874,700 A | 2/1999 | Hochgesang | |
| 5,878,872 A | 3/1999 | Tsai | |
| 5,898,147 A | 4/1999 | Domzaiski et al. | |
| 5,924,555 A | 7/1999 | Sadamori et al. | |
| 5,935,691 A | 8/1999 | Tsai | |
| 5,986,227 A | 11/1999 | Hon | |
| 6,020,565 A | 2/2000 | Pan | |
| 6,068,416 A | 5/2000 | Kumamoto et al. | |
| 6,215,420 B1 | 4/2001 | Harrison et al. | |
| 6,257,782 B1 | 7/2001 | Maruyama et al. | |
| 6,388,219 B2 | 5/2002 | Hsu et al. | |
| 6,423,918 B1 | 7/2002 | King et al. | |
| 6,482,032 B1 | 11/2002 | Szu et al. | |
| 6,542,355 B1 | 4/2003 | Huang | |
| 6,556,112 B1 | 4/2003 | Van Zeeland et al. | |
| 6,559,399 B2 | 5/2003 | Hsu et al. | |
| 6,572,289 B2 | 6/2003 | Lo et al. | |
| 6,624,369 B2 | 9/2003 | Ito et al. | |
| 6,759,614 B2 | 7/2004 | Yoneyama | |
| 6,762,381 B2 | 7/2004 | Kunthady et al. | |
| 6,765,503 B1 | 7/2004 | Chan et al. | |
| 6,797,906 B2 | 9/2004 | Ohashi | |
| 6,850,227 B2 | 2/2005 | Takahashi et al. | |
| 6,940,030 B2 * | 9/2005 | Takeda | H01H 13/705 200/343 |
| 6,977,352 B2 | 12/2005 | Oosawa | |
| 6,987,466 B1 | 1/2006 | Welch et al. | |
| 7,012,206 B2 | 3/2006 | Oikawa | |
| 7,129,930 B1 | 10/2006 | Cathey et al. | |
| 7,134,205 B2 | 11/2006 | Bruennel | |
| 7,151,236 B2 | 12/2006 | Ducruet et al. | |
| 7,154,059 B2 | 12/2006 | Chou | |
| 7,172,303 B2 | 2/2007 | Shipman et al. | |
| 7,301,113 B2 | 11/2007 | Nishimura et al. | |
| 7,378,607 B2 | 5/2008 | Koyano et al. | |
| 7,414,213 B2 | 8/2008 | Hwang | |
| 7,429,707 B2 | 9/2008 | Yanai et al. | |
| 7,432,460 B2 | 10/2008 | Clegg | |
| 7,510,342 B2 | 3/2009 | Lane et al. | |
| 7,531,764 B1 | 5/2009 | Lev et al. | |
| 7,541,554 B2 | 6/2009 | Hou | |
| 7,639,187 B2 | 12/2009 | Caballero et al. | |
| 7,781,690 B2 | 8/2010 | Ishii | |
| 7,813,774 B2 | 10/2010 | Perez-Noguera | |
| 7,842,895 B2 | 11/2010 | Lee | |
| 7,847,204 B2 | 12/2010 | Tsai | |
| 7,851,819 B2 | 12/2010 | Shi | |
| 7,866,866 B2 | 1/2011 | Wahlstrom | |
| 7,947,915 B2 | 5/2011 | Lee et al. | |
| 7,999,748 B2 | 8/2011 | Ligtenberg et al. | |
| 8,063,325 B2 | 11/2011 | Sung et al. | |
| 8,080,744 B2 | 12/2011 | Yeh et al. | |
| 8,109,650 B2 | 2/2012 | Chang et al. | |
| 8,119,945 B2 | 2/2012 | Lin | |
| 8,124,903 B2 | 2/2012 | Tatehata et al. | |
| 8,134,094 B2 | 3/2012 | Tsao et al. | |
| 8,143,982 B1 | 3/2012 | Lauder et al. | |
| 8,156,172 B2 | 4/2012 | Muehl et al. | |
| 8,212,160 B2 | 7/2012 | Tsao | |
| 8,212,162 B2 * | 7/2012 | Zhou | H01H 13/7057 200/5 A |
| 8,218,301 B2 | 7/2012 | Lee | |
| 8,232,958 B2 | 7/2012 | Tolbert | |
| 8,253,048 B2 | 8/2012 | Ozias et al. | |
| 8,253,052 B2 | 8/2012 | Chen | |
| 8,263,887 B2 | 9/2012 | Chen et al. | |
| 8,289,280 B2 | 10/2012 | Travis | |
| 8,299,382 B2 | 10/2012 | Takemae et al. | |
| 8,319,298 B2 | 11/2012 | Hsu | |
| 8,330,725 B2 | 12/2012 | Mahowald et al. | |
| 8,354,629 B2 | 1/2013 | Lin | |
| 8,378,857 B2 | 2/2013 | Pance | |
| 8,384,566 B2 | 2/2013 | Bocirnea | |
| 8,436,265 B2 | 5/2013 | Koike et al. | |
| 8,451,146 B2 | 5/2013 | Mahowald et al. | |
| 8,462,514 B2 | 6/2013 | Myers et al. | |
| 8,500,348 B2 | 8/2013 | Dumont et al. | |
| 8,502,094 B2 | 8/2013 | Chen | |
| 8,542,194 B2 | 9/2013 | Akens et al. | |
| 8,569,639 B2 | 10/2013 | Strittmatter | |
| 8,581,127 B2 | 11/2013 | Jhuang et al. | |
| 8,592,699 B2 * | 11/2013 | Kessler | H01H 3/125 200/343 |
| 8,592,702 B2 | 11/2013 | Tsai | |
| 8,592,703 B2 | 11/2013 | Johnson et al. | |
| 8,604,370 B2 * | 12/2013 | Chao | H01H 13/83 200/314 |
| 8,629,362 B1 | 1/2014 | Knighton et al. | |
| 8,642,904 B2 | 2/2014 | Chiba et al. | |
| 8,651,720 B2 | 2/2014 | Sherman et al. | |
| 8,659,882 B2 | 2/2014 | Liang et al. | |
| 8,731,618 B2 | 5/2014 | Jarvis et al. | |
| 8,748,767 B2 * | 6/2014 | Ozias | G06F 1/1662 200/310 |
| 8,759,705 B2 | 6/2014 | Funakoshi et al. | |
| 8,760,405 B2 | 6/2014 | Nam | |
| 8,786,548 B2 | 7/2014 | Oh et al. | |
| 8,791,378 B2 | 7/2014 | Lan | |
| 8,835,784 B2 * | 9/2014 | Hirota | H01H 21/24 200/343 |
| 8,847,711 B2 | 9/2014 | Yang et al. | |
| 8,854,312 B2 | 10/2014 | Meierling | |
| 8,870,477 B2 | 10/2014 | Merminod et al. | |
| 8,884,174 B2 | 11/2014 | Chou et al. | |
| 8,976,117 B2 | 3/2015 | Krahenbuhl et al. | |
| 9,063,627 B2 | 6/2015 | Yairi et al. | |
| 9,086,733 B2 | 7/2015 | Pance | |
| 9,087,663 B2 | 7/2015 | Los | |
| 9,213,416 B2 | 12/2015 | Chen | |
| 9,223,352 B2 | 12/2015 | Smith et al. | |
| 9,234,486 B2 | 1/2016 | Das et al. | |
| 9,275,810 B2 | 3/2016 | Pance et al. | |
| 9,300,033 B2 | 3/2016 | Han et al. | |
| 9,443,672 B2 | 9/2016 | Martisauskas | |
| 9,477,382 B2 | 10/2016 | Hicks et al. | |
| 2002/0079211 A1 | 6/2002 | Katayama et al. | |
| 2002/0093436 A1 | 7/2002 | Lien | |
| 2003/0169232 A1 | 9/2003 | Ito | |
| 2004/0257247 A1 | 12/2004 | Lin et al. | |
| 2006/0011458 A1 | 1/2006 | Purcocks | |
| 2006/0120790 A1 | 6/2006 | Chang | |
| 2006/0181511 A1 | 8/2006 | Woolley | |
| 2006/0243987 A1 | 11/2006 | Lai | |
| 2007/0200823 A1 | 8/2007 | Bytheway et al. | |
| 2007/0285393 A1 | 12/2007 | Ishakov | |
| 2008/0136782 A1 | 6/2008 | Mundt et al. | |
| 2008/0251370 A1 | 10/2008 | Aoki | |
| 2009/0103964 A1 | 4/2009 | Takagi et al. | |
| 2009/0128496 A1 | 5/2009 | Huang | |
| 2010/0066568 A1 | 3/2010 | Lee | |
| 2010/0109921 A1 | 5/2010 | Annerfors | |
| 2010/0213044 A1 | 8/2010 | Strittmatter et al. | |
| 2010/0253630 A1 | 10/2010 | Homma et al. | |
| 2011/0032127 A1 | 2/2011 | Roush | |

(56) References Cited

U.S. PATENT DOCUMENTS

| | | | |
|---|---|---|---|
| 2011/0056817 A1 | 3/2011 | Wu | |
| 2011/0056836 A1 | 3/2011 | Tatebe et al. | |
| 2011/0203912 A1 | 8/2011 | Niu et al. | |
| 2011/0205179 A1 | 8/2011 | Braun | |
| 2011/0267272 A1 | 11/2011 | Meyer et al. | |
| 2011/0303521 A1 | 12/2011 | Niu et al. | |
| 2012/0012446 A1 | 1/2012 | Hwa | |
| 2012/0090973 A1 | 4/2012 | Liu | |
| 2012/0098751 A1 | 4/2012 | Liu | |
| 2012/0168294 A1 | 7/2012 | Pegg | |
| 2012/0193202 A1 | 8/2012 | Chen | |
| 2012/0286701 A1 | 11/2012 | Yang et al. | |
| 2012/0298496 A1 | 11/2012 | Zhang | |
| 2012/0313856 A1 | 12/2012 | Hsieh | |
| 2013/0100030 A1 | 4/2013 | Los et al. | |
| 2013/0161170 A1 | 6/2013 | Fan et al. | |
| 2013/0162450 A1 | 6/2013 | Leong et al. | |
| 2013/0270090 A1 | 10/2013 | Lee | |
| 2014/0027259 A1* | 1/2014 | Kawana | H01H 13/705 200/517 |
| 2014/0071654 A1 | 3/2014 | Chien | |
| 2014/0090967 A1 | 4/2014 | Inagaki | |
| 2014/0098042 A1 | 4/2014 | Kuo et al. | |
| 2014/0116865 A1 | 5/2014 | Leong et al. | |
| 2014/0118264 A1 | 5/2014 | Leong et al. | |
| 2014/0151211 A1 | 6/2014 | Zhang | |
| 2014/0184496 A1 | 7/2014 | Gribetz et al. | |
| 2014/0218851 A1 | 8/2014 | Klein et al. | |
| 2014/0251772 A1 | 9/2014 | Welch et al. | |
| 2014/0252881 A1 | 9/2014 | Dinh et al. | |
| 2014/0291133 A1 | 10/2014 | Fu et al. | |
| 2014/0320436 A1 | 10/2014 | Modarres et al. | |
| 2014/0346025 A1 | 11/2014 | Hendren et al. | |
| 2014/0375141 A1 | 12/2014 | Nakajima | |
| 2015/0016038 A1 | 1/2015 | Niu et al. | |
| 2015/0083561 A1 | 3/2015 | Han et al. | |
| 2015/0090570 A1 | 4/2015 | Kwan et al. | |
| 2015/0090571 A1 | 4/2015 | Leong et al. | |
| 2015/0227207 A1 | 8/2015 | Winter et al. | |
| 2015/0243457 A1 | 8/2015 | Niu et al. | |
| 2015/0270073 A1 | 9/2015 | Yarak, III et al. | |
| 2015/0277559 A1 | 10/2015 | Vescovi et al. | |
| 2015/0287553 A1 | 10/2015 | Welch et al. | |
| 2015/0332874 A1 | 11/2015 | Brock et al. | |
| 2015/0348726 A1 | 12/2015 | Hendren | |
| 2015/0378391 A1 | 12/2015 | Huitema et al. | |
| 2016/0049266 A1 | 2/2016 | Stringer et al. | |
| 2016/0093452 A1 | 3/2016 | Zercoe et al. | |
| 2016/0172129 A1 | 6/2016 | Zercoe et al. | |
| 2016/0189890 A1 | 6/2016 | Leong et al. | |
| 2016/0189891 A1 | 6/2016 | Zercoe et al. | |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1855332 | 11/2006 |
| CN | 101051569 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102375550 | 3/2012 |
| CN | 102496509 | 6/2012 |
| CN | 10269527 | 8/2012 |
| CN | 202372927 | 8/2012 |
| CN | 102683072 | 9/2012 |
| CN | 202434387 | 9/2012 |
| CN | 102955573 | 3/2013 |
| CN | 102956386 | 3/2013 |
| CN | 103000417 | 3/2013 |
| CN | 103165327 | 6/2013 |
| CN | 103180979 | 6/2013 |
| CN | 103377841 | 10/2013 |
| CN | 103489986 | 1/2014 |
| CN | 103681056 | 3/2014 |
| CN | 203520312 | 4/2014 |
| CN | 203588895 | 5/2014 |
| CN | 103839715 | 6/2014 |
| CN | 103839722 | 6/2014 |
| CN | 103903891 | 7/2014 |
| CN | 103956290 | 7/2014 |
| CN | 204102769 | 1/2015 |
| DE | 2530176 | 1/1977 |
| DE | 3002772 | 7/1981 |
| DE | 29704100 | 4/1997 |
| EP | 0441993 | 8/1991 |
| EP | 1835272 | 9/2007 |
| EP | 1928008 | 6/2008 |
| EP | 2022606 | 6/2010 |
| EP | 2426688 | 3/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | H09204148 | 8/1997 |
| JP | H10312726 | 11/1998 |
| JP | H11194882 | 7/1999 |
| JP | 2000057871 | 2/2000 |
| JP | 2000339097 | 12/2000 |
| JP | 2001100889 | 4/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006277013 | 10/2006 |
| JP | 2006344609 | 12/2006 |
| JP | 2007514247 | 5/2007 |
| JP | 2007156983 | 6/2007 |
| JP | 2008021428 | 1/2008 |
| JP | 2008100129 | 5/2008 |
| JP | 2008191850 | 8/2008 |
| JP | 2008533559 | 8/2008 |

(56) References Cited

FOREIGN PATENT DOCUMENTS

| | | |
|---|---|---|
| JP | 2009181894 | 8/2009 |
| JP | 2010061956 | 3/2010 |
| JP | 2010244088 | 10/2010 |
| JP | 2010244302 | 10/2010 |
| JP | 2011065126 | 3/2011 |
| JP | 2011150804 | 8/2011 |
| JP | 2011524066 | 8/2011 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014216190 | 11/2014 |
| JP | 2014220039 | 11/2014 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2014175446 | 10/2014 |

OTHER PUBLICATIONS

U.S. Appl. No. 15/014,596, filed Feb. 3, 2016, pending.
U.S. Appl. No. 15/154,682, filed May 13, 2016, pending.
U.S. Appl. No. 15/154,706, filed May 13, 2016, pending.
U.S. Appl. No. 15/154,723, filed May 13, 2016, pending.
U.S. Appl. No. 15/154,768, filed May 13, 2016, pending.
U.S. Appl. No. 15/230,740, filed Aug. 8, 2016, pending.
U.S. Appl. No. 15/230,724, filed Aug. 8, 2016, pending.
U.S. Appl. No. 15/261,954, filed Sep. 11, 2016, pending.
U.S. Appl. No. 15/261,972, filed Sep. 11, 2016, pending.
U.S. Appl. No. 15/262,249, filed Sep. 12, 2016, pending.
U.S. Appl. No. 15/264,827, filed Sep. 14, 2016, pending.
U.S. Appl. No. 15/268,518, filed Sep. 16, 2016, pending.
U.S. Appl. No. 15/269,790, filed Sep. 19, 2016, pending.

* cited by examiner

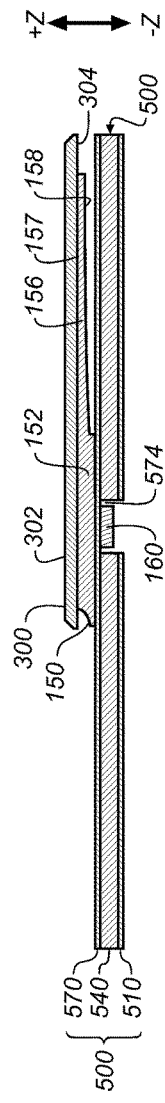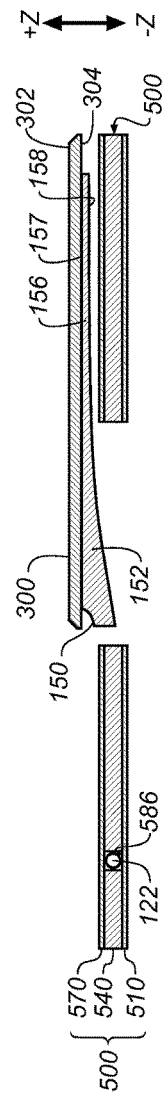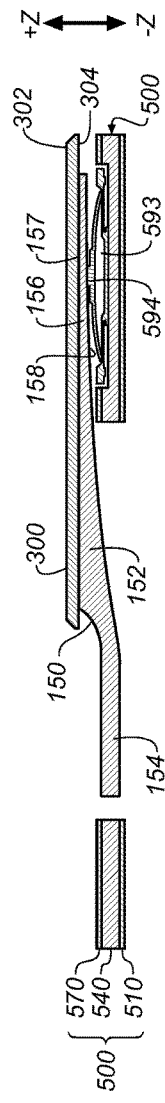

KEYBOARD HINGE MECHANISM

CROSS-REFERENCE TO RELATED APPLICATION

This application is a nonprovisional patent application of and claims the benefit to U.S. Provisional Patent Application No. 61/934,285, filed Jan. 31, 2014 and titled "Keyboard Hinge Mechanism," the disclosure of which is hereby incorporated herein by reference in its entirety.

TECHNICAL FIELD

The present disclosure is directed to a keyboard hinge mechanism. Specifically, the present disclosure is directed to a keyboard hinge mechanism that provides both mechanical support and electrical connections or circuitry to a keyboard thereby reducing the overall thickness of the keyboard.

BACKGROUND

Many electronic devices (e.g., desktop computers, laptop computers, mobile phones, and the like) include a keyboard as one of its input devices. Each electronic device may have a different type of keyboard. Typically, keyboards are differentiated by the switch technology they employ. One of the most common keyboard types is a dome-switch keyboard. A dome-switch keyboard may include a keycap, an electrical membrane or other type of electrical contact mechanism, and an elastic dome disposed between the keycap and the electrical membrane. In order to provide support for the keycap, a dome-switch assembly may include a support structure such as a scissor mechanism or a butterfly mechanism that contract and expand during depression and release of the keycap. When the keycap is depressed from its original position, the support structure contracts and an uppermost portion of the elastic dome moves downward from its original position and contacts the electrical membrane to cause a switching operation or event. When the keycap is released, the support structure expands and the uppermost portion of the elastic dome returns to its original position. As a result, the keycap moves back to its original position.

It is often desirable to make electronic devices and their associated input mechanisms (e.g., a keyboard) smaller. To accomplish this, some components of the electronic device or the input mechanism may need to be smaller. Additionally, certain movable components of the device may have less space to move. However, the reduced space may make it difficult for the components to perform their intended function.

For example, a typical keycap is designed to move a certain maximum distance when it is depressed. The total distance from the natural (undepressed) position of the keycap to its farthest (depressed) position is often referred to as the "travel" or "travel amount." When an electronic device is smaller, the available travel may be smaller. However, smaller travel may require smaller or a restricted range of movement of a corresponding support structure and elastic dome which may interfere with the components operating according to their intended specifications. That is, conventional components may or may not be suitable to provide a low travel switch mechanism under stringent design and spacing requirements.

It is with respect to these and other general considerations that embodiments have been made. Also, although relatively specific problems have been discussed, it should be understood that the embodiments should not be limited to solving the specific problems identified in the background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

One or more embodiments of the present disclosure provide an integrated pivot component for use with a key. In certain embodiments, the integrated pivot component includes a hinge assembly having at least one arm extending from a support portion. The at least one arm is operative to interface with a portion of a substrate to form a hinge point. The integrated pivot component may also include a light guide structure coupled to the support portion. The integrated pivot component is operative to rotate about the hinge point during a keystroke of the key.

In other embodiments, a keyboard may include a substrate having an array of switches arranged in a plurality of rows. The substrate may also include a first plurality of pivot components with each of the first plurality of pivot components having a first configuration. Further, each of the first plurality of pivot components is operative to interact with a corresponding switch in a first row of the plurality of rows of switches. The keyboard may also include a second plurality of pivot components each having a second configuration. Each of the second plurality of pivot components may also be coupled to the substrate and operative to interact with a corresponding switch in a second row of the plurality of rows of switches.

In yet another embodiment, a low travel switch mechanism is disclosed. The low travel switch mechanism may include a keycap, a substrate disposed beneath the keycap, and a dome residing in the substrate. The low travel switch mechanism may also include a pivot component disposed between the keycap and the dome. The pivot component may be coupled to the substrate at an interconnection point and is operative to pivot about the interconnection point when the keycap receives a keystroke.

BRIEF DESCRIPTION OF THE DRAWINGS

FIG. 3 illustrates a cross-sectional view of the low travel switch mechanism of FIG. 1 taken from a line I3-I3 between a line I1 and a line I2 of FIG. 1 according to one or more embodiments of the present disclosure;

FIG. 4 illustrates a cross-sectional view of the low travel switch mechanism of FIG. 1 taken from a line I4-I4 between line I1 and line I2 of FIG. 1 according to one or more embodiments of the present disclosure;

FIG. 5 illustrates a cross-sectional view of the low travel switch mechanism of FIG. 1 taken from a line I5-I5 between line I1 and line I2 of FIG. 1 according to one or more embodiments of the present disclosure;

DETAILED DESCRIPTION

Figure 1:
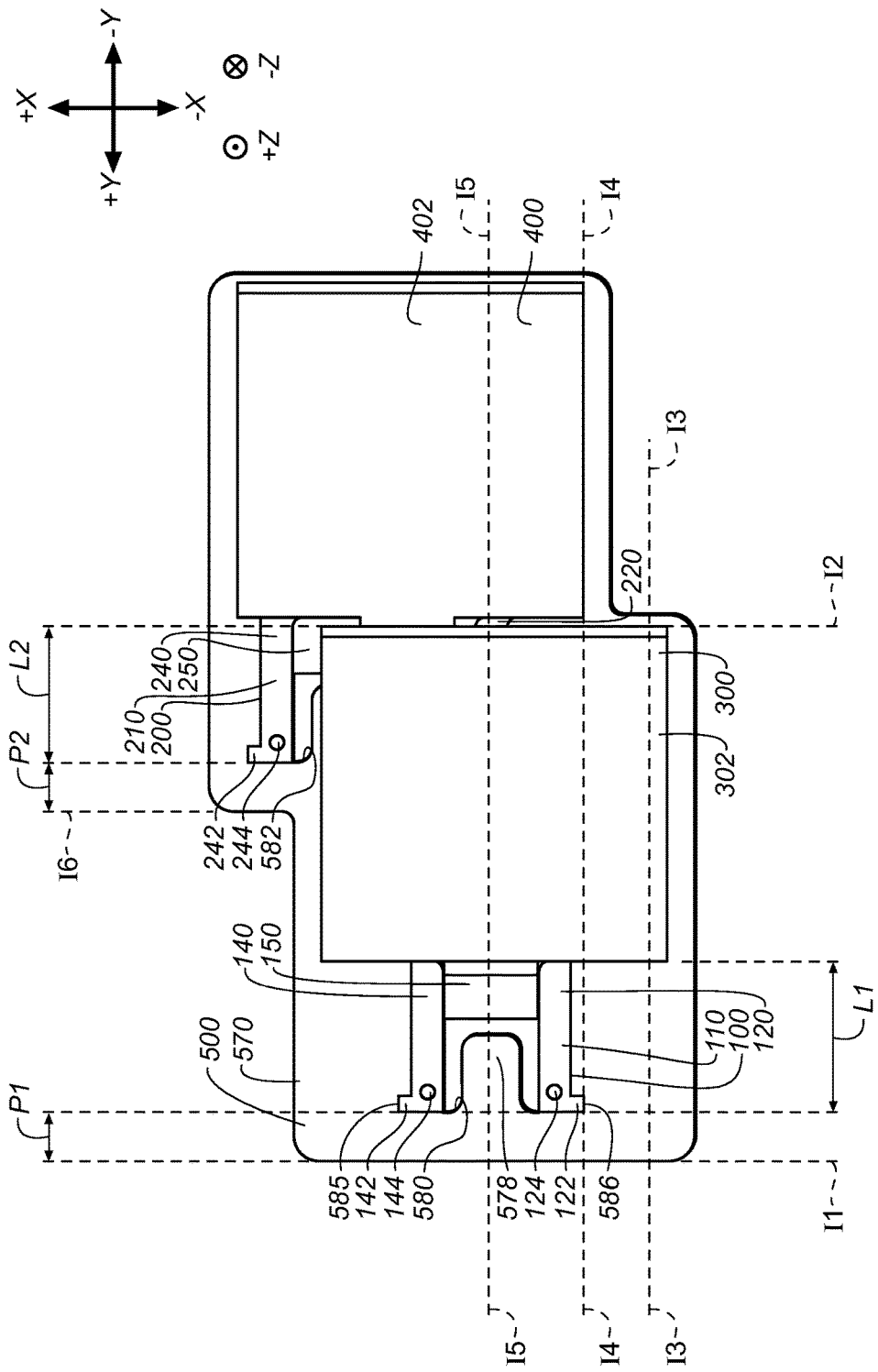
FIG. 1 illustrates a top view of a low travel switch mechanism according to one or more embodiments of the present disclosure.

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. The following detailed description is, therefore, not to be taken in a limiting sense.

As briefly described above, when an electronic device or a keyboard is made smaller, the travel of keys of the device or of the keyboard may also need to be smaller. However, smaller travel may require smaller or a restricted range of movement of certain moveable components of the keyboard. Such components may include a conventional support structure (e.g., scissor mechanism). However, the restricted range of movement may interfere with the ability of the component to operate according to its intended functionality. Thus, in order to provide a switch mechanism that may provide low travel under stringent design and spacing requirements, a different type of support structure may be employed.

In some embodiments, a low travel switch mechanism may include a substrate, a dome coupled to the substrate, a keycap, and a pivot component disposed between the keycap and the dome. The pivot component may include a hinge assembly that may function similarly to a cantilevered hinge, and may be composed of any suitable type of material (e.g., metal, plastic, a combination of metal with insert molded plastic, etc.). The hinge assembly may secure to and pivot with respect to the substrate via one or more hinges or joints that may be secured to corresponding portions of the substrate.

The hinge assembly may include a support portion for supporting the keycap. When the keycap is subjected to a keystroke in a downward direction, the support portion of the hinge assembly may be operative to pivot in the downward direction of the keystroke and displace at least a portion of the dome to trigger a switch operation or event. In certain embodiments, this pivot motion may not be exactly parallel to the downward movement of the keycap since the support portion of the hinge assembly may only rotate about the pivot point. However, because the travel of the keycap is relatively small (e.g., 0.5 millimeters to 0.75 millimeters), the support portion may appear to move substantially in the direction of the keystroke. In other embodiments, the pivot mechanism may be constructed in such a way as to enable the pivot motion to be parallel to the downward movement of the keycap.

In some embodiments, the dome may be an elastomeric dome (e.g., a metal dome, a rubber dome, etc.) and may be operative to bias the hinge assembly in an upward direction when the overlying keycap is not being depressed. That is, the support portion of the hinge assembly may contact and rest on the dome. In another embodiment, the support portion may contact the dome but may not apply an amount of pressure that deforms the shape of the dome when the key is not pressed. However, when the keycap is subjected to a keystroke in a downward direction, the support portion may deform or displace at least a portion of the dome in the downward direction. When the keycap is subsequently released, the elasticity of the dome may cause the dome to return to its natural state which may move the support portion back to its original biased state.

In embodiments, the pivot point of the hinge assembly may be in the same plane as the support portion such that no additional space may be needed in the Z-direction. In some embodiments, by employing the hinge assembly, the low travel switch mechanism may occupy only about 2 millimeters in the Z-direction.

One or more embodiments further provide an assembly to prevent the support portion from moving or traveling too far in the upward (or +Z-direction). Movement in the upward or +Z-direction may cause the corresponding keycap to move away from its intended position. As such, the hinge assembly may include one or more upstops that may latch onto or otherwise interface with a portion of the substrate.

In some embodiments, the substrate may include multiple layers made from various types of material. For example, the substrate may include three layers (e.g., a circuit board layer sandwiched between two metal layers). In such configurations, the top layer may provide a planar surface that may interact with the upstops of the hinge assembly. The substrate may also include one or more modified portions (e.g., cutouts) that may be operative to receive and secure the hinge interconnects or joints of the hinge assembly. In some embodiments, the top and bottom layers of the substrate may sandwich the joints of the hinge assembly to secure the hinge assembly thereto. Each of the layers of the substrate may also include additional cutouts that may enable the support portion of the hinge assembly to travel in the downward or −(minus) Z-direction. Moreover, the substrate may also be configured to house the dome, such as, for example, using one or more of the layers, in a predefined position so as to bias the support portion as described above. In yet other embodiments, the substrate may be configured to receive or to be coupled to multiple hinge assemblies. In this manner, adjacent keys may share the same substrate and operate along with its corresponding hinge assembly.

The interconnects or joints of the hinge assembly may extend from one or more structural arms of the hinge assembly. In particular, the arms may be coupled to the support portion on one end and to the joints on another end. In some embodiments, the hinge assembly may include only a single arm. In these embodiments, the single arm may include two joints or interlock features that may each extend away from the single arm and be secured to respective portions of the substrate.

In other embodiments, the hinge assembly may include two arms. In these embodiments, each arm may include or be coupled to a single joint or interlock feature that may each extend away from an arm and be secured to respective portions of the substrate.

In yet other embodiments, the one or more structural arms may be shaped to circumvent any features that may be included in the various layers of the substrate. For example, in embodiments where the substrate may support multiple hinge assemblies, one or more arms of a first hinge assembly may be shaped to circumvent the dome corresponding to a second hinge assembly positioned adjacent to the first hinge assembly.

In addition to providing structural support for the low travel switch mechanism, the hinge assembly may also provide optical features. For example, the hinge assembly may be integrated (e.g., via an adhesive, insert molding, or any other suitable method of integration) with a light guide structure, such as a light guide panel, or other such light source.

In these embodiments, the low travel switch mechanism may include a substrate, a dome coupled to the substrate, a keycap, and an integrated pivot component. The integrated pivot component may include a hinge assembly integrated with a light guide structure, and may be disposed between the keycap and the dome. The light guide structure may reside over the support portion of the hinge assembly. In some embodiments, the light guide structure may be translucent such that a light emitting diode ("LED") may be disposed therein to emit light. For example, the LED may be a side-firing LED. Moreover, the keycap may be composed of any suitable material (e.g., metal, plastic, glass, etc.), and may be secured to a top surface of the light guide structure. In this manner, when the keycap is subjected to a keystroke in the downward direction, the light guide structure (and thus the support portion of the hinge assembly) may pivot in the downward direction of the keystroke and displace at least a portion of the dome to trigger a switch operation or event.

In some embodiments, the hinge assembly may be composed of metal (or some other material), and may be integrated with a light guide structure that may be inserted molded to the hinge assembly. In such embodiments, the support portion of the hinge assembly may include one or more holes for aligning or securing the light guide structure in the insert molding. In other embodiments, the hinge assembly may be secured to the light guide structure via any suitable mechanism (e.g., one or more adhesives, screws, etc.). In yet other embodiments, the hinge assembly and the light guide structure may be a wholly integrated part (e.g., plastic part).

Figure 2:
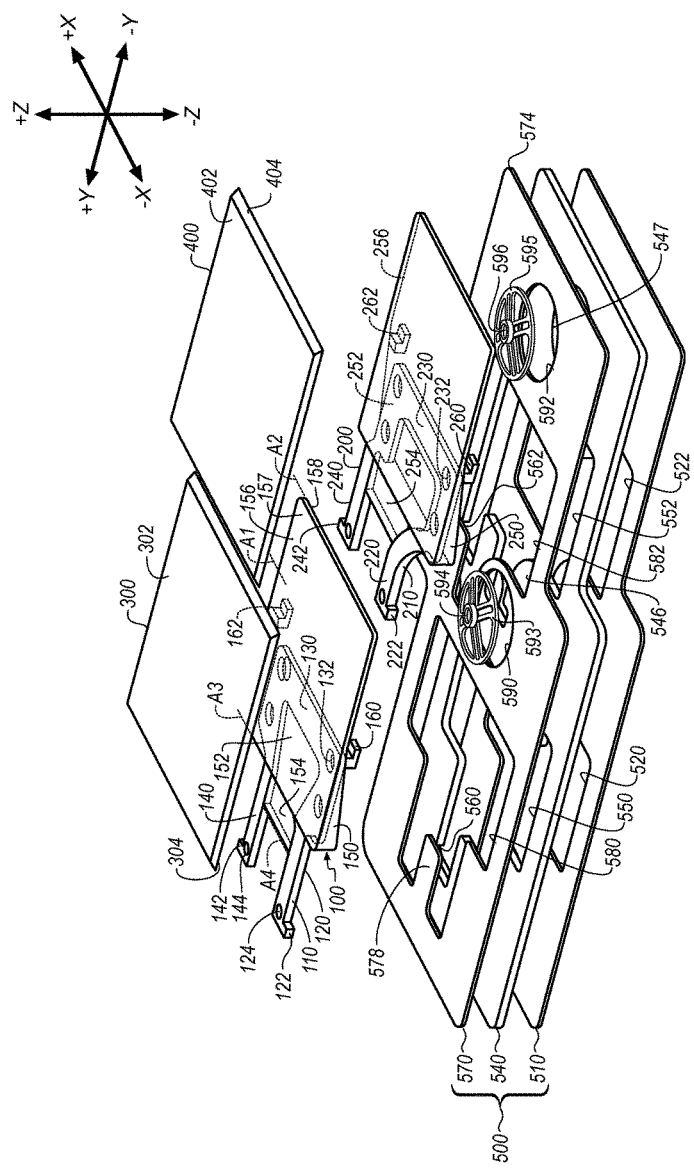
FIG. 2 illustrates an exploded view of the low travel switch mechanism of FIG. 1 according to one or more embodiments of the present disclosure.

Referring to the figures, FIG. 1 illustrates a top view of two adjacent low travel switch mechanisms according to one or more embodiments of the present disclosure and FIG. 2 is an exploded view of the two adjacent low travel switch mechanisms of FIG. 1. As shown in FIGS. 1 and 2, a first one of the adjacent switch mechanisms may include an integrated pivot component 100, a keycap 300, and a dome 593 (FIG. 2). Similarly, a second one of the adjacent switch mechanisms may include an integrated pivot component 200, a keycap 400, and a dome 595. In some embodiments, keycap 300 and keycap 400 may be composed of any suitable material (e.g., glass, plastic, etc.) and may function as keys of a keyboard. Keycap 300 may include a top surface 302 and a bottom surface 304 (FIG. 2).

The top surface 302 may be operative to receive a force (e.g., from a user) and bottom surface 304 may reside over integrated pivot component 100. Additionally, keycap 400 may include similar top and bottom surfaces 402 and 404 (FIG. 2). As with top surface 302 and bottom surface 304, top surface 402 may also be operative to receive a similar force (e.g., from a user), and bottom surface 404 may reside over integrated pivot component 200.

In certain embodiments and as discussed above, domes 593 and 595 may be composed of any suitable material (e.g., metal, rubber, etc.), and may reside beneath keycaps 300 and 400, respectively. As shown in FIG. 2, domes 593 and 595 may include nubs 594 and 596 respectively that may directly or indirectly interface (e.g., via integrated pivot components 100 and 200, respectively) with the corresponding keycaps when the keycaps are displaced in the −Z-direction.

In some instances domes 593 and 595 may be elastic. As such, domes 593 and 595 may deform or otherwise change shape. In this manner, when a force is applied to keycap 300 in the −Z-direction, keycap 300 may press onto and displace nub 595 in the −Z-direction (thereby buckling dome 593) to cause or trigger a switch event or operation. Subsequently, when the force is removed from keycap 300, dome 593 may unbuckle and nub 595 may displace back to its original position in the +Z-direction.

As shown in FIGS. 1 and 2, the two adjacent switch mechanisms may share a common substrate 500. Substrate 500 may be composed of multiple layers of material. As shown in FIG. 2, substrate 500 may include a middle layer 540 that may be sandwiched by top layer 570 and bottom layer 510. Each layer may be composed of any suitable material (e.g., middle layer 540 may be a circuit board composed of FR4 grade material, and the top layer 510 and the bottom layer 570 may be composed of metal, such as, for example, steel).

Each layer of substrate 500 may include a set of cutouts for accommodating various components of the two adjacent switch mechanisms. In particular, layers 510, 540, and 570 may include cutouts 520, 550, and 580, respectively, for accommodating integrated pivot component 100. In addition, layers 510, 540, and 570 may also include cutouts 522, 552, and 582, respectively, for accommodating integrated pivot component 200. In addition to accommodating integrated pivot components 100 and 200, cutouts 520, 522, 550, 552, 580, and 582 may also allow portions of integrated pivot components 100 and 200 to travel in the −Z-direction to effect switching events or operations.

As shown in FIG. 2, top layer 570 may also include a cutout 590 for accommodating dome 593, and a cutout 592 for accommodating dome 595. Moreover, middle layer 540 may include a recess 546 upon which dome 593 may reside, and a recess 547 upon which dome 595 may reside. While residing in these recesses, domes 593 and 595 may, in their natural and undepressed states, bias portions of integrated pivot components 100 and 200 in the +Z-direction (described in more detail below).

Cutouts 520, 550, and 580 may also include one or more notches or receiving features for coupling to or otherwise interfacing with corresponding interlock features (described in more detail below) of the integrated pivot component 100. As shown in FIG. 1, for example, cutout 580 may include a receiving feature 585 and an opposite facing receiving feature 586. As shown in FIG. 2, for example, cutout 550 may also include a receiving feature 560. Although not shown in FIGS. 1 and 2, cutout 550 may also include a receiving feature opposite receiving feature 560 in the −X-direction.

Similarly, cutouts, 522, 552, and 582 may also include one or more receiving features for interfacing with corresponding interlock features of integrated pivot component 200. As shown in FIG. 1, for example, cutout 582 may include a receiving feature 578. Although not shown in FIGS. 1 and 2, cutout 582 may also include a receiving feature opposite receiving feature 578 in the −X-direction. Further, FIG. 2 also shows that cutout 552 may also include a receiving feature 562. Although not shown in FIGS. 1 and 2, cutout 552 may additionally include a receiving feature opposite receiving feature 562 in the −X-direction.

It should be appreciated that any one of cutouts 520, 522, 550, 552, 580, and 582 may include any suitable number of receiving features for interfacing with corresponding interlock features of integrated pivot components 100 and 200. In some embodiments, only middle layer 540 may include receiving features for interfacing with the corresponding interlock features of integrated pivot components 100 and 200. In these embodiments, top and bottom layers 510 and 570 may sandwich these interlock features to form respective pivot points for integrated pivot components 100 and 200. As discussed above, the integrated pivot component 100 may include a hinge assembly 110 and a light guide structure 150.

In embodiments, hinge assembly 110 may have functionality that is similar to a cantilevered hinge. In such embodiments, the hinge assembly 110 may be composed of any suitable material (e.g., metal, plastic, a combination of metal with insert molded plastic, etc.). As shown in FIG. 2, for example, hinge assembly 110 may be shaped like a frame although other shapes are contemplated.

Hinge assembly 110 may also include a support portion 130 and two structural arms 120 and 140 that may extend from support portion 130. In some embodiments, arms 120 and 140 and support portion 130 may form a contiguous component. In other embodiments, arms 120 and 140 and support portion 130 may be separate components that may be coupled (e.g., via adhesive elements or any other suitable coupling elements) to form hinge assembly 110. In certain embodiments, arm 120 may include an interconnect, joint, or interlock feature 122 at one end, and arm 140 may include a similar interlock feature 142 at one end. Each one of interlock features 122 and 142, and corresponding securement features 124 and 144 may be configured to couple, secure, or otherwise interact with a corresponding portion of substrate 500.

As previously discussed, the hinge assembly 110 may include a light guide structure 150. The light guide structure 150 may be composed of any suitable material (e.g., glass, plastic, etc.). In some embodiments, light guide structure 150 may be wholly translucent. In other embodiments, light guide structure 150 may only be partially translucent. Although not shown in FIGS. 1 and 2, in some embodiments, light guide structure 150 may include one or more light emitting diodes ("LEDs") residing therein and configured to emit light therefrom. For example, light guide structure 150 may include one or more side-firing LEDs that may illuminate keycap 300.

As shown in the figures, the light guide structure 150 may include a base portion 152, a tail portion 154, and an extender 156. As shown in FIG. 2, extender 156 may span from a line A1 to an end of light guide structure 150 in the −Y-direction at line A2. Base portion 152 may span from line A1 to a line A3 in the +Y-direction, and tail portion 154 may span from line A3 to a line A4 in the +Y-direction. Various portions of light guide structure 150 may vary in thickness (e.g., Z-direction thickness). For example, a Z-direction thickness of tail portion 154 may vary from line A4 to line A3. As another example, a Z-direction thickness of base portion 152 may vary from line A3 to line A1. In some embodiments, a Z-direction thickness of extender 156 may vary from line A1 to line A2. In other embodiments, the Z-direction thickness of extender 156 may be substantially constant from line A1 to line A2.

The hinge assembly 110 may be integrated with light guide structure 150 in any suitable manner. In some embodiments, hinge assembly 110 may be coupled or otherwise secured to light guide structure 150 via one or more adhesive elements or securing members (e.g., glue, screws, etc.). In other embodiments, light guide structure 150 may be inserted molded to hinge assembly 110. As shown in FIG. 2, for example, hinge assembly 110 may include a plurality of holes 132 that may secure light guide structure 150 to hinge assembly 110 when light guide structure 150 is insert molded to hinge assembly 110. In yet other embodiments, hinge assembly 110 and light guide structure 150 may not be separate components, but may be formed as a single component (e.g., a single metal or plastic component).

As shown in FIG. 1, substrate 500 may accommodate integrated pivot component 100 and dome 593. In addition, keycap 300 may reside over integrated pivot component 100 and dome 593. Hinge assembly 110 of integrated pivot component 100 may couple or otherwise secure to substrate 500 via interlock features 122 and 142. In particular, interlock features 122 and 142 may interface with corresponding receiving features of cutouts 510, 540, and 570 (e.g., receiving features 585, 586, 560, etc.). When hinge assembly 110 is coupled to substrate 500 in this manner, hinge assembly 110 may be able to pivot, from the coupled position, with respect to substrate 500.

The pivot point or the coupled position of hinge assembly 110 to substrate 500 may be in the same plane as support portion 130 of hinge assembly 110. In this manner, no additional space may be required in the Z-direction to accommodate hinge assembly 110. In some embodiments, the entirety of each of the first and second ones of the adjacent low travel switch mechanisms (e.g., including substrate 500) may occupy about 2 millimeters in the Z-direction.

Although FIGS. 1 and 2 show hinge assembly 110 including two arms 120 and 140, in some embodiments, hinge assembly 110 may only include only a single arm or may include more than two arms. In the single arm embodiment the single arm may include two interlock features that may each extend away from the single arm from a respective side of the single arm. Further, the interlock features may be operative to interface with corresponding receiving features of the substrate.

As shown in FIG. 2, light guide structure 150 may include upstops 160 and 162 that may be configured to latch onto or otherwise interface with corresponding portions of substrate 500. For example, top layer 570 may provide a planar surface such that bottom surface 574 of top layer 570 may interact with upstops 160 and 162. In this manner, support portion 130 and light guide structure 150 may be prevented from moving or traveling too far in the +Z-direction (and thus, moving keycap 300 away from its intended natural position). Although FIG. 2 shows light guide structure 150 including upstops 160 and 162, in some embodiments, hinge assembly 110 may instead include the upstops 160 and 162. In these embodiments, for example, hinge assembly 110 may include the upstops 160 and 162 at certain edges of support portion 130.

To conserve space in laying out the keys of a keyboard, the two adjacent switch mechanisms may be positioned as shown in FIGS. 1 and 2. In particular, the second one of the adjacent switch mechanisms may be shifted from the first one of the adjacent switch mechanism in the +X-direction. Moreover, a portion of integrated pivot component 200 (e.g., via arm 220 of hinge assembly 210) may be configured to circumvent any features that may be included in the various layers of substrate 500. For example, as shown in FIG. 2, arm 210 of hinge assembly 210 may have a curved shaped, and may traverse the periphery of dome 593, but not through dome 593. It should be appreciated that, although FIG. 2 shows arm 210 having a particular curved shape, arm 210 may be curved in any suitable manner as long as it circumvents or otherwise traverses away from dome 593.

It should also be appreciated that, other than the circumventing feature of integrated pivot component 200, integrated pivot component 200 may be similar in all other respects to integrated pivot component 100. Integrated pivot component 200 may include a hinge assembly 210 and a light guide structure 250. Similar to hinge assembly 110, hinge assembly 210 may be shaped like a frame or other such shape. Hinge assembly 210 may include a support portion 230 and two structural arms 220 and 240 that may extend from support portion 230. Arm 220 may include an interconnect, joint, or interlock feature 222 at one end, and arm 240 may include a similar interlock feature 242 at one end. Similar to interlock features 122 and 142, each one of interlock features 222 and 242 may be configured to couple, secure, or otherwise interact with a corresponding portion of substrate 500. Light guide structure 250 may also be similar to light guide structure 150, and may include a base portion 252, a tail portion 254, an extender 256 and upstops 260 and 262. Further, hinge assembly 210 may include a plurality of holes 232 that may secure light guide structure 250 to the hinge assembly 210.

Although FIGS. 1 and 2 show two adjacent low travel switch mechanisms sharing a common substrate 500 the two switch mechanisms may be separate from one another and may each employ a separate substrate. Moreover, in some embodiments, more than two adjacent low travel switch mechanisms may share common substrate 500. For example, multiple arrays (e.g., rows and columns) of switch mechanisms may share common substrate 500 to form a complete keyboard switch mechanism for a device.

FIG. 3 illustrates a cross-sectional view of the low travel switch mechanism of FIG. 1 taken from a line I3-I3 between a line I1 and a line I2 of FIG. 1 according to one or more embodiments of the present disclosure. FIG. 4 illustrates a cross-sectional view of the low travel switch mechanism of FIG. 1 taken from a line I4-I4 between line I1 and line I2 of FIG. 1 according to one or more embodiments of the present disclosure. FIG. 5 illustrates a cross-sectional view of the low travel switch mechanism of FIG. 1 taken from a line I5-I5 between line I1 and line I2 of FIG. 1 according to one or more embodiments of the present disclosure. As will be discussed in more detail below, each one of FIGS. 3-5 may show one of the switch mechanisms (e.g., a first switch mechanism of the adjacent switch mechanisms shown in FIGS. 1 and 2) in an initial, undepressed, state (e.g., prior to any force being applied).

Referring to FIG. 3, a light guide structure 150 may be disposed between keycap 300 and top layer 570 of substrate 500. In particular, bottom surface 304 of keycap 300 may reside on top surface 157 of extender 156, and a bottom surface of base portion 152 may reside on top layer 570. As also shown in FIG. 3, upstop 160 of light guide structure 150 may interface with bottom surface 574 of top layer 570, and may be operative to prevent light guide structure 150 (and thus hinge assembly 110 and keycap 300) from moving farther in the +Z-direction than the position shown in FIG. 3.

As shown in FIG. 4, interlock feature 122 may be coupled to receiving feature 586 to form at least a portion of a pivot point for hinge assembly 110. As described above with respect to FIGS. 1 and 2, in some embodiments, interlock feature 122 may be sandwiched by portions of top layer 570 and bottom layer 510 to secure the pivot point.

As shown in FIG. 5, light guide structure 150 may also be disposed between keycap 300 and dome 593. As described above with respect to FIGS. 1 and 2, substrate 500 may include cutout 590 and recess 546 for accommodating dome 593. Dome 593 may be positioned so as to bias hinge assembly 110 in the +Z-direction when keycap 300 is not being depressed (e.g., by a user). More particularly, dome 593 and integrated pivot component 100 may be positioned such that dome 593 may bias light guide structure 150 in the +Z-direction, as shown in FIG. 5.

In some embodiments, when keycap 300 is not being depressed, bottom surface 158 of light guide structure 150 may contact a nub 594 but may not necessarily apply sufficient pressure in the −Z-direction to deform the shape of dome 593. When keycap 300 is subjected to a keystroke in the −Z-direction, the light guide structure 150 may also move in the −Z-direction and deform or displace at least a portion of dome 593 in the −Z-direction. That is, when keycap 300 is subjected to a keystroke, light guide structure 150 (and thus support portion 130 of hinge assembly 110) may pivot in substantially the −Z-direction and displace at least a portion of dome 593 to trigger a switch operation or event. It should be appreciated that this pivot motion may not be exactly parallel to the downward movement of keycap 300, since support portion 130 of hinge assembly 110 may only rotate about the pivot point. However, because the travel of keycap 300 may be small (e.g., 0.5 millimeters to 0.75 millimeters), light guide structure 150 and support portion 130 may appear to move substantially in the direction of the keystroke. When keycap 300 is subsequently released, the elasticity of dome 593 may cause it to return to its original state, and may cause light guide structure 150 to also return move to its original biased state. It is also contemplated that the pivot motion may also be made in parallel to the downward movement of the keycap 300.

Although the first one of the adjacent switch mechanisms of FIGS. 1 and 2 has been described with respect to FIGS. 3-5, it should be appreciated that a similar description may also be made for the second one of the adjacent switch mechanisms shown and described above with respect to FIGS. 1 and 2.

Figure 6:
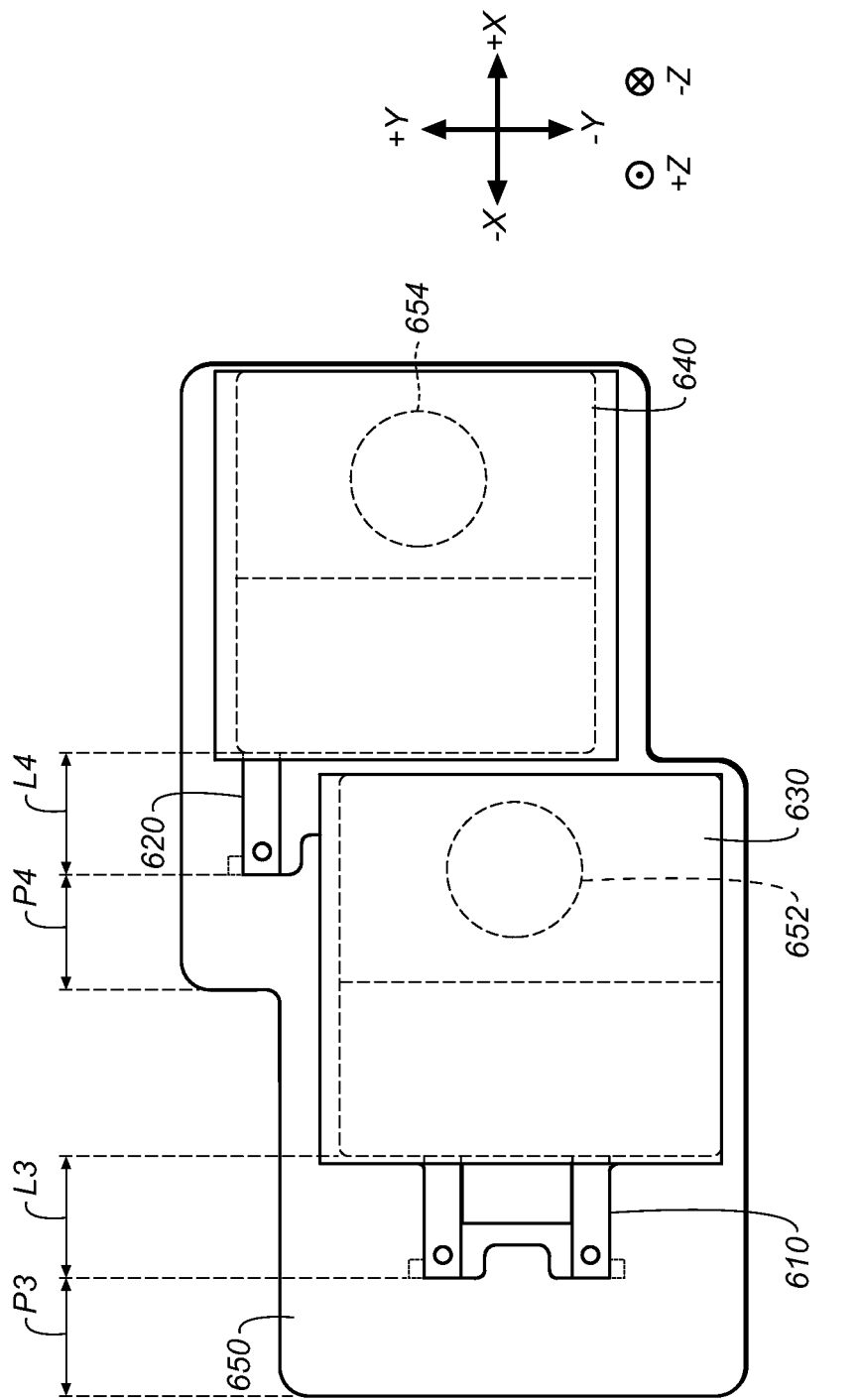
FIG. 6 illustrates a top view of a low travel switch mechanism according to one or more alternative embodiments of the present disclosure.

FIG. 6 illustrates a top view of a low travel switch mechanism according to one or more alternative embodiments of the present disclosure. As shown in FIG. 6, the alternative switch mechanism may share a common substrate 650. In embodiments, a first switch mechanism may include an integrated pivot component 610, a keycap 630, and a dome 652. Similarly, a second switch mechanism may include an integrated pivot component 620, a keycap 640, and a dome 654. In some embodiments, the travel switch mechanism shown and described with respect to FIG. 6 may be similar to the low travel switch mechanism shown and described with respect to FIGS. 1 and 2. However, the length of the various arms of integrated pivot components 610 and 620 may be different from those of the arms of integrated pivot components described above with respect to pivot components 100 and 200. As a result, the distance of the arms of integrated pivot components 610 and 620 from corresponding adjacent edges of substrate 650 may be different from those of the arms of integrated pivot components 100 and 200 from corresponding adjacent edges of substrate 500.

For example, as shown in FIG. 1, arms 120 and 140 of integrated pivot component 100 may each have a length L1, and arms 220 and 240 of integrated pivot component 200 may each have a length L2. Moreover, arms 120 and 140 may be offset from an adjacent edge (e.g., at line I1) in the −Y-direction by a distance P1, and arms 220 and 240 may be offset from an adjacent edge (e.g., at line I6) in the −Y-direction by a distance P2. In some embodiments, length L1 may be about equal to length L2, and distance P1 may be about equal to distance P2. In contrast, as shown in FIG. 6, the arms of integrated pivot component 610 may be smaller in length than those of integrated pivot component 100, and the arms of integrated pivot component 620 may be smaller in length than those of integrated pivot component 200. In particular, the arms of integrated pivot component 610 may each have a length L3 that may be smaller than length L1, and the arms of integrated pivot component 620 may each have a length L4 that may be smaller than length L2. As a result, the arms of integrated pivot component 610 may be offset from an adjacent edge in the −Y-direction by a distance P3 that may be greater than distance P1, and the arms of integrated pivot component 620 may be offset from an adjacent edge in the −Y-direction by a distance P4 that may be greater than distance P2.

As can be seen from FIGS. 1 and 6, certain physical dimensions of the low travel switch mechanism may be made smaller or larger depending on a desired layout of the switch mechanism in the X-Y plane. Moreover, the low travel switch mechanisms may be accommodated in a common Z-plane (e.g., the same Z-stack), without the need to increase required spacing in the Z-direction.

Figure 7:
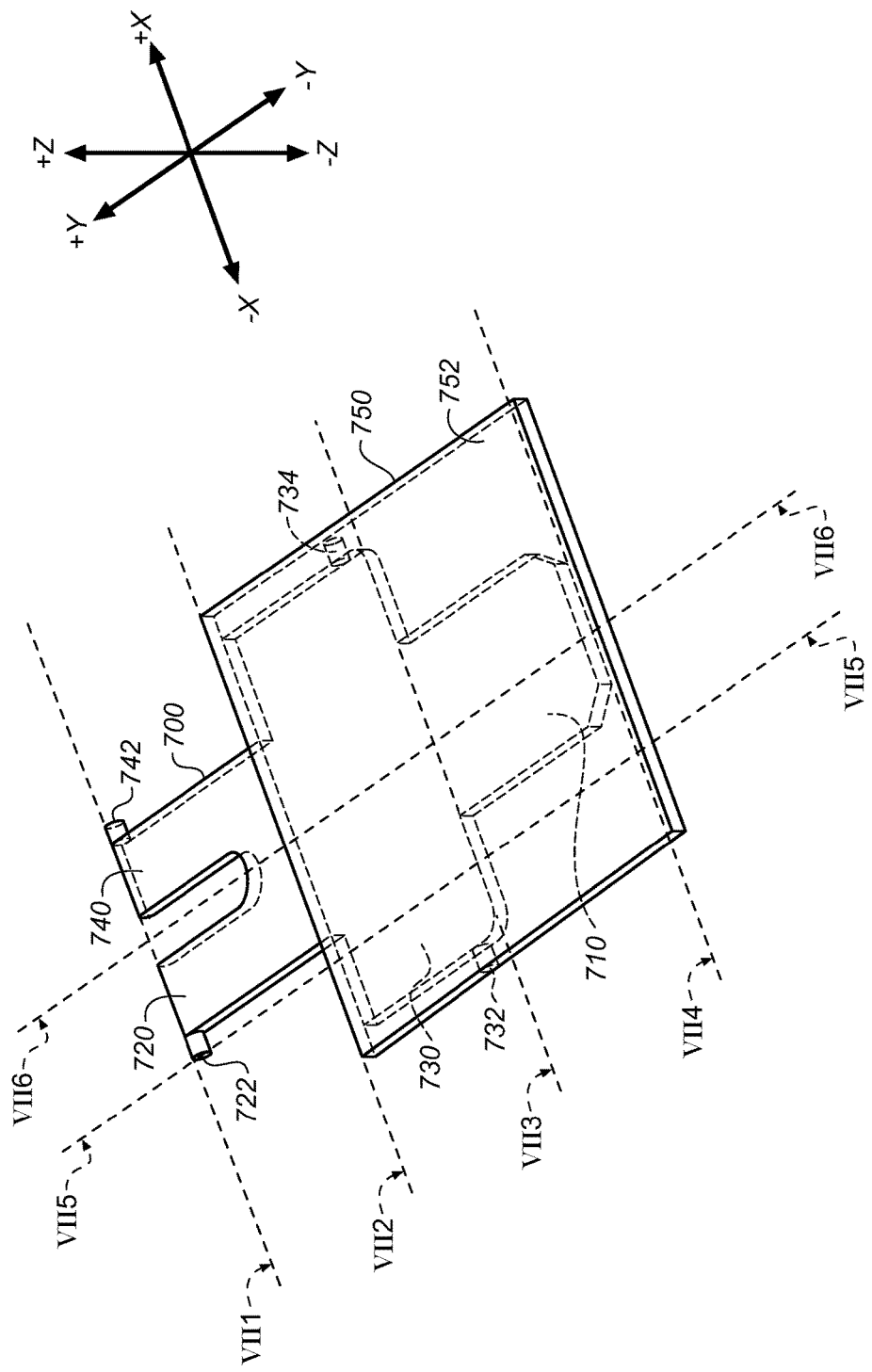
FIG. 7 illustrates a perspective view of a hinge assembly and a keycap according to one or more embodiments of the present disclosure.

In other embodiments, a pivot component may not be integrated with a light guide structure. For example, a standalone pivot component may only include a hinge assembly. FIG. 7 is a perspective view of a hinge assembly 700 and a keycap 750, in accordance with at least one embodiment. Hinge assembly 700 may be similar to hinge assembly 110, and may include a body 730, an extender 710, and an arm portion that may include arms 720 and 740. The arm portion may span from a line VII1 to a line VII2, body 730 may span from line VII2 to a line VII3, and extender 710 may span from a line VII3 to a line VII4.

Arm 720 may include an interlock feature 722 that may be similar to interlock feature 122 of hinge assembly 110, and arm 724 may include an interlock feature 742 that may be similar to interlock feature 142 of hinge assembly 110. For example, interlock features 722 and 724 may be operative to interface with corresponding receiving features (e.g., holes or notches) of a substrate (not shown in FIG. 7) to form a pivot point.

In certain embodiments, body 730 may include upstops 732 and 734 that may be similar to upstops 160 and 162 of hinge assembly 110. For example, upstops 732 and 734 may be operative to interface with a portion of a substrate (not shown in FIG. 7) so as to prevent body 730 and extender 710 (and thus keycap 750) from moving beyond a predefined position in the +Z-direction. Keycap 750 may be similar to keycap 300 and may reside above a portion of hinge assembly 700. Additionally, keycap 750 may be operative to move body 730 and extender 710 in the −Z-direction when a force is applied to top surface 752 of keycap 750.

Figure 8:
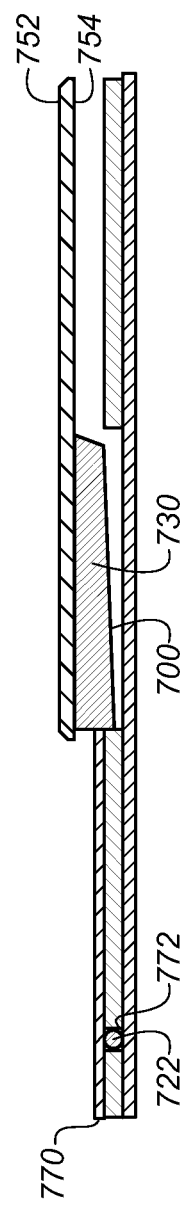
FIG. 8 illustrates a cross-sectional view of the hinge assembly and the keycap of FIG. 7, including a substrate, taken from a line VII5-VII5 according to one or more embodiments of the present disclosure.
Figure 9:
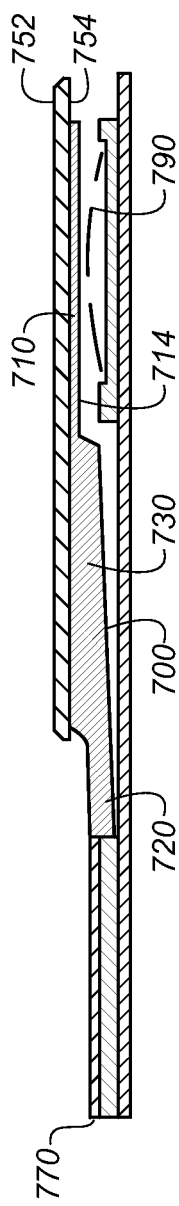
FIG. 9 illustrates a cross-sectional view of the hinge assembly and the keycap of FIG. 7, including a substrate and a dome, taken from a line VII6-VII6 according to one or more embodiments of the present disclosure.

FIG. 8 is a cross-sectional view of hinge assembly 700 and keycap 750, taken from a line VII5-VII5, including a substrate 770. FIG. 9 is a cross-sectional view of hinge assembly 700 and keycap 750, taken from a line VII6-VII6, including substrate 770 and a dome 790. Each one of FIGS. 8 and 9 may show hinge assembly 700, and keycap 750 in an initial, undepressed, state (e.g., prior to any force being applied). As shown in FIG. 8, hinge assembly 700 may be disposed beneath keycap 750 and may be hinged via interlock feature 722 to a receiving feature 772 of substrate 770. Receiving feature 772 may, for example, be similar to receiving feature 586 of substrate 500.

As shown in FIG. 9, extender 710 may be coupled to a bottom surface 754 of the keycap 750 and dome 790. Similar to substrate 500, substrate 770 may also include one or more cutouts and recesses for accommodating dome 790. Dome 790 may be positioned so as to bias hinge assembly 700 in the +Z-direction when keycap 750 is not being depressed. More particularly, dome 790 and hinge assembly 700 may be positioned such that dome 790 may bias extender 710 in the +Z-direction as shown in FIG. 8. Although FIG. 9 may not show a nub feature between dome 790 and bottom surface 714 of extender 710, it should be appreciated that dome 790 may include such a nub feature. Moreover, in some embodiments, dome 790 may not include a nub feature. In these embodiments, extender 710 may include a protruding portion (not shown) that may protrude from bottom surface 714 in the −Z-direction, and that may be operative to contact and press onto dome 790 during a keystroke.

In the embodiments where dome 790 includes a nub feature and when keycap 750 is not being depressed, the bottom surface 714 of extender 710 may contact this nub feature. However, the bottom surface 714 may not apply sufficient pressure in the −Z-direction to deform the shape of dome 790 when keycap 750 is not undergoing a keystroke. When keycap 750 is subjected to a keystroke in the −Z-direction, body 730 and extender 710 may also move in the −Z-direction and deform or displace at least a portion of dome 790 in the −Z-direction. That is, when keycap 750 is subjected to a keystroke, hinge assembly 700 may pivot in substantially the −Z-direction and displace at least a portion of dome 790 to trigger a switch operation or event.

It should be appreciated that this pivot motion, similar to that of hinge assembly 110, may not be exactly parallel to the downward movement of keycap 750, since extender 710 of hinge assembly 700 may only rotate about the pivot point. However, because the travel of keycap 750 may be small (e.g., 0.5 millimeters to 0.75 millimeters), body 730 and extender 710 may appear to move substantially in the direction of the keystroke. When keycap 750 is subsequently released, the elasticity of dome 790 may cause it to return to its original state, and may cause body 730 and extender 710 to also return move to its original biased state.

It is to be understood that many changes may be made to the above disclosure without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up and "down," "front" and "back," "top" and "bottom," "left" and "right," "length" and "width," and the like are used herein only for convenience, and that no fixed or absolute directional or orientational limitations are intended by the use of these words.

For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof.

Therefore, those skilled in the art will appreciate that the invention can be practiced by other than the described embodiments, which are presented for purposes of illustration rather than of limitation.

The description and illustration of one or more embodiments provided in this disclosure are not intended to limit or restrict the scope of the present disclosure as claimed. The embodiments, examples, and details provided in this disclosure are considered sufficient to convey possession and enable others to make and use the best mode of the claimed embodiments. Additionally, the claimed embodiments should not be construed as being limited to any embodiment, example, or detail provided above. Regardless of whether shown and described in combination or separately, the various features, including structural features and methodological features, are intended to be selectively included or omitted to produce an embodiment with a particular set of features. Having been provided with the description and illustration of the present application, one skilled in the art may envision variations, modifications, and alternate embodiments falling within the spirit of the broader aspects of the embodiments described herein that do not depart from the broader scope of the claimed embodiments.

We claim:

1. A key comprising:
a keycap;
a substrate positioned below the keycap;
a switch positioned on the substrate below the keycap; and
a hinge assembly comprising:
a support portion coupled to and positioned below the keycap; and
an arm coupled to the support portion at a first end of the arm and extending outward beyond a periphery of the keycap,
wherein:
a second end of the arm interfaces with the substrate to define a hinge point; and
the arm and support portion are operative to rotate about the hinge point during a keystroke of the key.

2. The key of claim 1, wherein:
the arm comprises an interlock feature that extends away from the arm in a direction perpendicular to a longitudinal axis of the arm.

3. The key of claim 1, wherein:
the arm is a first arm;
the hinge assembly comprises a second arm coupled to the support portion at a first end of the second arm, and extending beyond a periphery of the keycap; and
a second end of the second arm interfaces with the substrate at the hinge point.

4. The key of claim 3, wherein the first arm and the second arm are straight.

5. The key of claim 3, wherein the first arm is straight and the second arm is curved.

6. The key of claim 1, wherein the hinge assembly is constructed from at least one of metal and plastic.

7. The key of claim 1, wherein the hinge assembly further comprises a light guide structure coupled to the support portion.

8. The key of claim 7, wherein the support portion comprises at least one hole, and wherein at least a portion of the light guide structure resides within the at least one hole.

9. The key of claim 7, wherein the light guide structure is insert molded around at least a portion of the support portion.

10. The key of claim 7, wherein the light guide structure is glued to at least a portion of the support portion.

11. The key of claim 7, wherein the light guide structure is at least partially translucent and includes a side firing light emitting diode.

12. A keyboard comprising:
a substrate;
a first key in a first row of keys and comprising:
a first keycap; and
a first integrated pivot component comprising:
a first support structure coupled to and positioned below the first keycap; and
a first arm rigidly attached at a first end to the first support structure and extending beyond a periphery of the first keycap;
a second key in a second row of keys and comprising:
a second keycap; and
a second integrated pivot component comprising:
a second support structure coupled to and positioned below the second keycap; and
a second arm having a first end attached to the second support structure and extending beyond a periphery of the second keycap; wherein:
a second end of the first arm interfaces with a first pivot point in the substrate;
the first integrated pivot component is operative to rotate about the first pivot point;
a second end of the second arm interfaces with a second pivot point in the substrate; and
the second integrated pivot component is operative to rotate about the second pivot point.

13. The keyboard of claim 12, wherein:
the first integrated pivot component further comprises a first light guide structure; and
the second integrated pivot component further comprises a second light guide structure.

14. The keyboard of claim 13, wherein the first and second light guide structures each comprise a respective light guide panel.

15. The keyboard of claim 13, wherein the first and second light guide structures each comprise at least one side-firing light emitting diode.

16. The keyboard of claim 12, wherein:
the substrate comprises a middle layer sandwiched between a top layer and a bottom layer; and
the first pivot point and the second pivot point are positioned in the middle layer.

17. The keyboard of claim 16, wherein the top and bottom layers are composed of steel.

18. The keyboard of claim 16, wherein the middle layer is composed of FR4 grade material.

19. The keyboard of claim 16, wherein the middle layer comprises a circuit board.

20. The keyboard of claim 16, wherein:
the top layer, the middle layer and the bottom layer each comprise respective first cutouts that accommodate the first integrated pivot component; and
the top layer, the middle layer and the bottom layer each comprise respective second cutouts that accommodate the second integrated pivot component.

21. The keyboard of claim 12, wherein the first and the second integrated pivot components each comprise at least one protruding upstop component operative to interface with a portion of the substrate to prevent the respective integrated pivot component from moving beyond a predefined position.

22. The keyboard of claim 12, further comprising:
a first switch positioned on the substrate beneath the first support structure of the first integrated pivot component;
a second switch positioned on the substrate beneath the second support structure of the integrated pivot component;
wherein the first switch and the second switch each comprise a dome, each dome being operative to bias the corresponding integrated pivot component in a predefined direction.

23. The keyboard of claim 12, wherein the second integrated pivot component is shifted by a predefined amount within the second row from the first integrated pivot component.

24. The keyboard of claim 22, wherein the first support structure is aligned with the first switch in a direction of a keystroke of the first key.

25. A low travel switch mechanism comprising:
a keycap;
a substrate disposed beneath the keycap;
a dome residing in the substrate; and
a pivot component disposed between the keycap and the dome and comprising:
a support portion attached to the keycap;
an arm coupled at a first end to the support portion and extending beyond an edge of the keycap; wherein:
the arm is coupled at a second end to the substrate at an interconnection point; and
the pivot component is operative to rotate about the interconnection point when the keycap receives a keystroke.

26. The low travel switch mechanism of claim 25, wherein the support portion is operative apply a force to the dome to cause a switch event when the keycap receives the keystroke.

27. The low travel switch mechanism of claim 25, wherein the dome is operative to bias the pivot component in a predefined position when the keycap is not receiving the keystroke.

28. The low travel switch mechanism of claim 25, wherein:
the substrate comprises a middle layer sandwiched between a top layer and a bottom layer; and
the interconnection point is positioned in the middle layer.

29. The low travel switch mechanism of claim 28, wherein the dome is attached to the middle layer.

30. The low travel switch mechanism of claim 28, wherein the top layer, the middle layer and the bottom layer each comprise respective cutouts that accommodate the pivot component.

31. The low travel switch mechanism of claim 25, wherein the pivot component comprises a light guide, the light guide comprising at least one side-firing light emitting diode.

\* \* \* \* \*